(12) United States Patent
Yang

(10) Patent No.: US 7,729,119 B2
(45) Date of Patent: Jun. 1, 2010

(54) HEAT DISSIPATION DEVICE

(75) Inventor: Jian Yang, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 245 days.

(21) Appl. No.: 11/946,475

(22) Filed: Nov. 28, 2007

(65) Prior Publication Data

US 2009/0135562 A1    May 28, 2009

(51) Int. Cl.
H05K 7/20    (2006.01)

(52) U.S. Cl. .................. 361/700; 361/695; 361/704; 165/80.3; 165/104.33; 257/714

(58) Field of Classification Search .................. 361/688, 361/697, 700, 703, 704, 709, 719, 695, 699
See application file for complete search history.

(56) References Cited

U.S. PATENT DOCUMENTS

| | | | | |
|---|---|---|---|---|
| 3,149,666 | A * | 9/1964 | Coe | 165/121 |
| 6,152,214 | A | 11/2000 | Wagner | |
| 6,469,894 | B2 * | 10/2002 | Ubukata | 361/700 |
| 6,542,364 | B2 * | 4/2003 | Lai et al. | 361/697 |
| 6,938,682 | B2 * | 9/2005 | Chen et al. | 165/104.33 |
| 7,120,019 | B2 * | 10/2006 | Foster et al. | 361/695 |
| 7,312,994 | B2 * | 12/2007 | Lee et al. | 361/700 |
| 7,475,718 | B2 * | 1/2009 | Reyzin et al. | 165/104.33 |
| 2002/0121358 | A1 * | 9/2002 | Lee | 165/80.3 |
| 2004/0108104 | A1 * | 6/2004 | Luo | 165/181 |
| 2005/0067144 | A1 * | 3/2005 | Chou | 165/80.3 |
| 2005/0092465 | A1 * | 5/2005 | Lin et al. | 165/104.21 |
| 2006/0238979 | A1 * | 10/2006 | Liu | 361/699 |
| 2007/0188995 | A1 * | 8/2007 | Franz et al. | 361/704 |

* cited by examiner

*Primary Examiner*—Jayprakash N Gandhi
*Assistant Examiner*—Courtney Smith
(74) *Attorney, Agent, or Firm*—Jeffrey T. Knapp

(57) ABSTRACT

A heat dissipation device includes a base, a heat-dissipation portion attached to the base, at least one heat pipe connecting the base and the heat-dissipation portion and a fan directly secured to the heat-dissipation portion. The heat-dissipation portion comprises a square, tubular housing having opposite front and rear end portions opening to surroundings and a plurality of fins extending inclinedly and inwardly from an inner circumferential periphery of the housing. The housing of the heat-dissipation portion is employed as a fan duct to guide an airflow generated by the fan through the fins; the inclined orientation of the fins facilitates the airflow to flow toward the inner circumferential periphery of the housing and lower parts of the fins adjacent the inner circumferential periphery, whereby the airflow can effectively take heat away from the heat-dissipation portion.

15 Claims, 4 Drawing Sheets

HEAT DISSIPATION DEVICE

BACKGROUND OF THE INVENTION

1. Field of the Invention

The present invention relates to a heat dissipation device for removing heat from an electronic device, and more particularly to a heat dissipation device which can more effectively use an airflow generated by a fan to improve heat dissipation capacity thereof.

2. Description of Related Art

As computer technology continues to advance, electronic components such as central processing units (CPUs) of computers are being made to provide faster operational speeds and greater functional capabilities. When a CPU operates at a high speed in a computer enclosure, its temperature is greatly increased. It is desired to dissipate the heat quickly, by using, for example, a heat dissipation device attached to the CPU in the enclosure. This allows the CPU and other electronic components in the enclosure to function within their normal operating temperature ranges, thereby assuring the quality of data management, storage and transfer.

Conventionally, a related heat dissipation device includes a heat sink and a fan. The heat sink can be mounted in contact with a CPU inside a computer. The fan is usually positioned on the heat sink and generates a high-pressured airflow blowing downwards into the heat sink, causing the heat to be dissipated into the surroundings. The heat sink comprises a cylinder-shaped central core and a plurality of fins radially extending outwardly from the central core. The fan is mounted above the heat sink via a fan bracket buckled to a top portion of the heat sink. The fan draws outside cooling air downwardly into the heat sink. Due to the fins being configured extending radially, airflow generated by the fan is dispersed out of the fins along various directions of the fins before reaching a bottom portion of the heat sink where large amounts of heat accumulate. Thus, the related heat dissipation device has a low heat-dissipating efficiency. In other situations, a fan duct can be mounted to the heat sink; thus, more airflow from the fan can be guided to the bottom portion of the heat sink. However, it is expensive to manufacture and mount the fan duct to the heat sink.

SUMMARY OF THE INVENTION

A heat dissipation device in accordance with a preferred embodiment of the present invention includes a base, a heat-dissipation portion attached to the base, at least one heat pipe connecting the base and the heat-dissipation portion and a fan directly secured to a front side of the heat-dissipation portion. The heat-dissipation portion comprises a housing having opposite front and rear end portions opening to surroundings and a plurality of fins extending inwardly from an inner circumferential periphery of the housing and cooperatively defining a through hole in a center portion of the heat-dissipation portion. The housing has a plurality of sidewalls. The fins are inclinedly extended from the sidewalls, respectively. The housing of the heat-dissipation portion encircles the fins and is employed as a fan duct to guide an airflow generated by the fan to flow through the fins. Due to the inclination of the fins, when the airflow flows through the fins, the airflow is guided by the fins to flow toward the sidewalls and lower parts of the fins which are located near the inner circumferential periphery of the housing, whereby the airflow can have a sufficient contact with the sidewalls and the lower parts of the fins where most of heat absorbed by the heat dissipation portion from an electronic component accumulates.

Other advantages and novel features will become more apparent from the following detailed description of preferred embodiments when taken in conjunction with the accompanying drawings, in which:

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
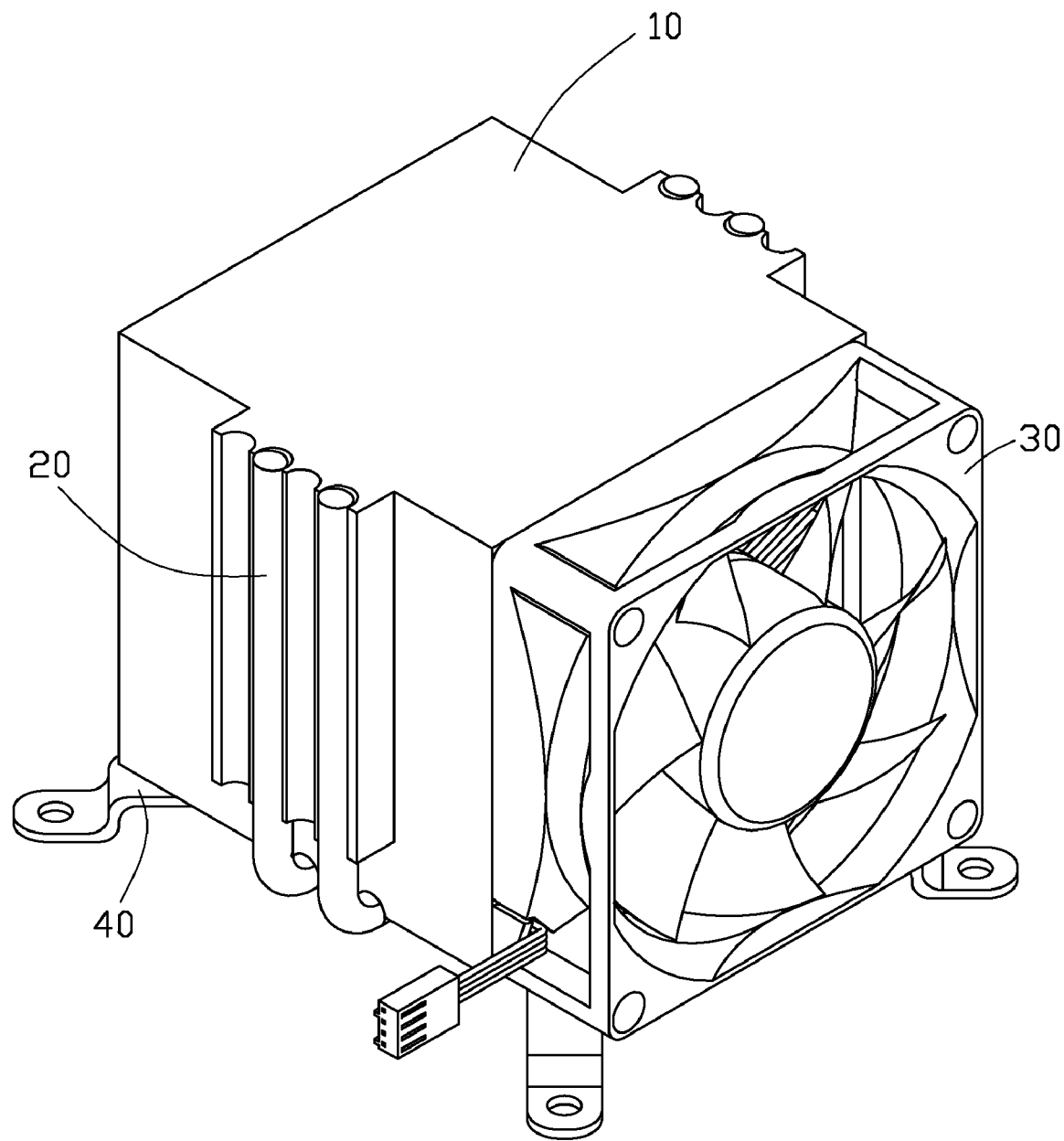
FIG. 1 is an assembled view of a heat dissipation device according to a preferred embodiment of the present invention.

Referring to FIG. 1, a heat dissipation device in accordance with a preferred embodiment of the present invention, which is used for dissipating heat from an electronic component (not shown) mounted on an printed circuit board (not shown) is illustrated. The heat dissipation device comprises a heat sink 10, two pairs of heat pipes 20 attached to two opposite lateral sides of the heat sink 10 and a fan 30 directly secured at a front side of the heat sink 10. The heat dissipation device further comprises two locking members 40 engaging with the heat sink 10 to secure the heat dissipation device to the printed circuit board so that the heat sink 10 can have an intimate contact with the electronic component.

Figure 2:
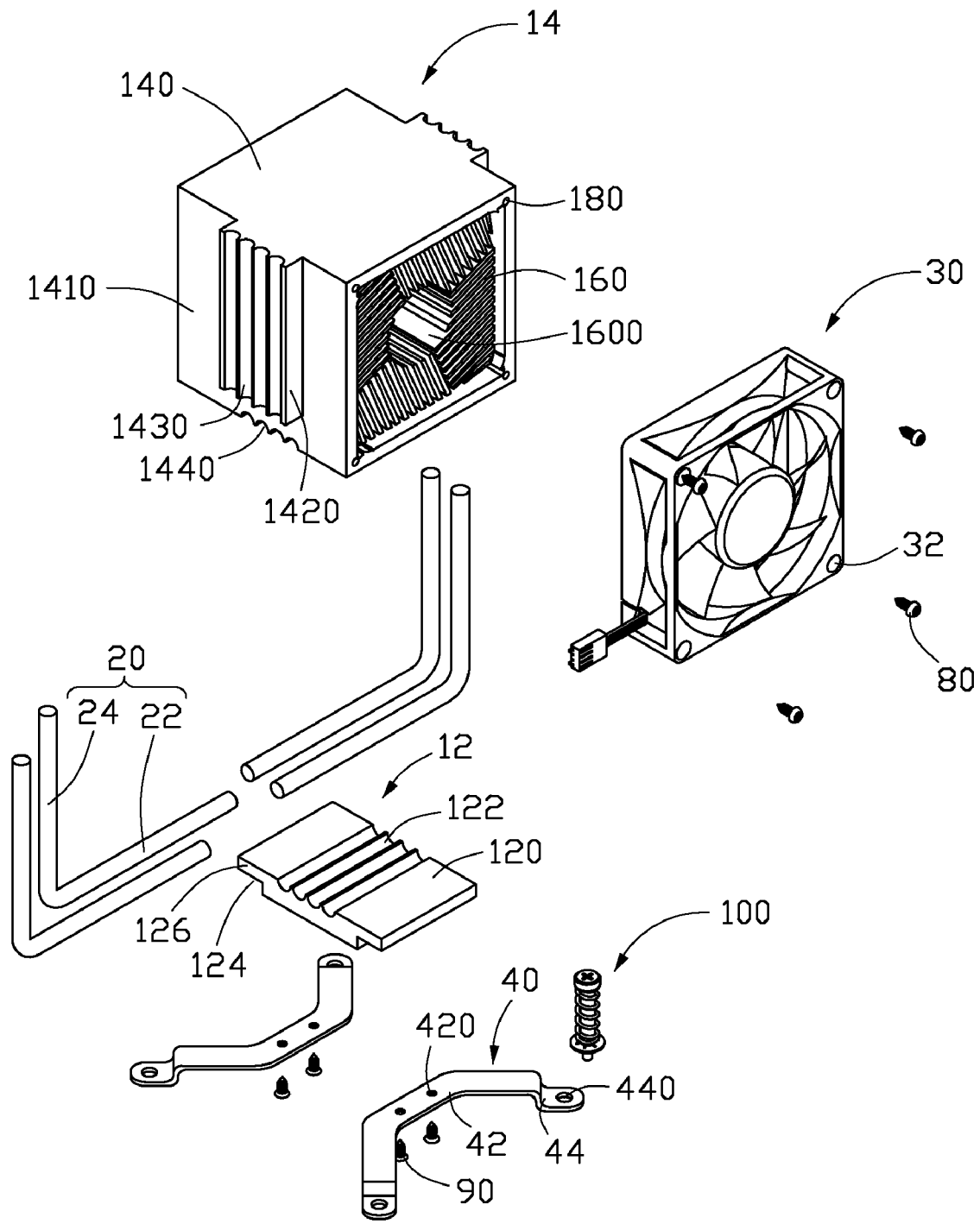
FIG. 2 is an exploded view of FIG. 1.

Referring to FIGS. 1-2, the heat sink 10 which is made of a thermally conductive material such as copper or aluminum, comprises a base 12 and a heat-dissipation portion 14 attached to the base 12. The base 12 is substantially rectangular, and has a flat bottom surface (not labeled) for attaching to the electronic component and a flat top surface 120 opposing the flat bottom surface of the base 12. The base 12 defines four parallel first grooves 122 in a center portion of the flat top surface 120 thereof, for receiving the heat pipes 20. The base 12 further defines two undercuts 124 in two opposite sides of the flat bottom surface thereof to form two locking portions 126, for fastening with the locking members 40. The undercuts 124 are parallel to the first grooves 122. Each locking portion 126 defines two locking holes (not shown) in a bottom surface thereof for fastening the locking members 40 to the locking portions 126.

The heat-dissipation portion 14 comprises a housing 140 and a plurality of fins 160 integrally extending from an inner circumferential periphery of the housing 140 toward a center of the housing 140. The housing 140 has a shape of a hollow square with opposite front and rear end portions opening to surroundings. Preferably, the heat-dissipation portion 14 is formed as a monolithic piece by aluminum extrusion. The housing 140 comprises four congruent rectangular sidewalls 1410 encircling the fins 160, thus forming a fan duct around the fins 160. Five parallel flanges 1420 are integrally formed on a center portion of an outer surface of each of opposite lateral sidewalls 1410 of the housing 140. Four slots 1430 are therefore formed between the flanges 1420 on each of the lateral sidewalls 1410 of the housing 140, for receiving the heat pipes 20 therein. Four arc-shaped parallel second grooves 1440 are defined in a bottom sidewall 1410 of the housing 140 and correspond to the first grooves 122 in the flat top surface 120 of the base 12. The first and second grooves 122, 1440 cooperatively form four passages (not labeled) for accommodating the heat pipes 20 therein when the heat-dissipation portion 14 is mounted on the flat top surface 120 of the base 12. Four screw holes 180 are defined in four corners of the front end portion of the housing 140, for engaging with screws 80 to mount the fan 30 on the front end portion of the housing 140 of the heat-dissipation portion 14. The fins 160 extend inwardly from inner surfaces of the four sidewalls 1410 of the housing 140 and cooperatively define a circular through hole 1600 through a center portion of the heat-dissipation portion 14 along a front-to-rear direction. The through hole 1600 is provided in line with a central hub of an impeller (not labeled) of the fan 30 for reducing a weight of the heat-dissipation portion 14. The fan 30 generates almost no or a very low airflow pressure at the hub. The fins 160 are oriented inclinedly to their respective corresponding sidewalls 1410 of the housing 140. The fins 160 have different extension lengths. The fins 160 are spaced from each other at uniform intervals; thus, a plurality of airflow passages (not labeled) are defined between the fins 160 for the airflow to flow therethrough. Four screws 80 are used to extend through holes 32 defined in four corners of the fan 30 and engage in the screw holes 180 of the front end portion of the housing 140 of the heat-dissipation portion 14, thereby mounting the fan 30 to the front end portion of the housing 140 of the heat-dissipation portion 14.

Each of the heat pipes 20 has a substantially L-shaped configuration. Each heat pipe 20 comprises a heat-receiving section 22 and a heat-discharging section 24 perpendicularly extending from an end of the heat-receiving section 22. The heat-receiving sections 22 of the two pairs of heat pipes 20 are soldered in the corresponding passages formed by the first and second grooves 122, 1440 when the heat-dissipation portion 14 is mounted on the flat top surface 120 of the base 12 of the heat sink 10. The heat-receiving sections 22 of each pair of the heat pipes 20 are spaced with each other in the passages. The heat-receiving sections 22 of one of the two pairs of heat pipes 20 are located adjacent to the heat-receiving sections 22 of the other of the two pairs of heat pipes 20. The heat-discharging sections 24 of each pair of heat pipes 20 are respectively received in the spaced slots 1430 and thermally contact with the flanges 1420 and the outer surface of the lateral sidewalls 1410 of the housing 140 of the heat-dissipation portion 14.

Each locking member 40 comprises a locking lever 42 engaging with the corresponding locking portion 126 of the base 12 and two legs 44 extending outwardly from opposite ends of the locking lever 42 and angled with the locking lever 42. The locking lever 42 defines bores 420 therein. Screws 90 are used to extend through the bores 420 and engage in the locking holes in the base 12 to secure the locking members 40 to the bottom surfaces of the locking portions 126 of the base 12. The legs 44 define four apertures 440 therein for four screws 100 (only one shown) to extend therethrough to engage in corresponding fixtures (not shown) under the printed circuit board to thereby mount the heat dissipation device to the printed circuit board.

Figure 3:
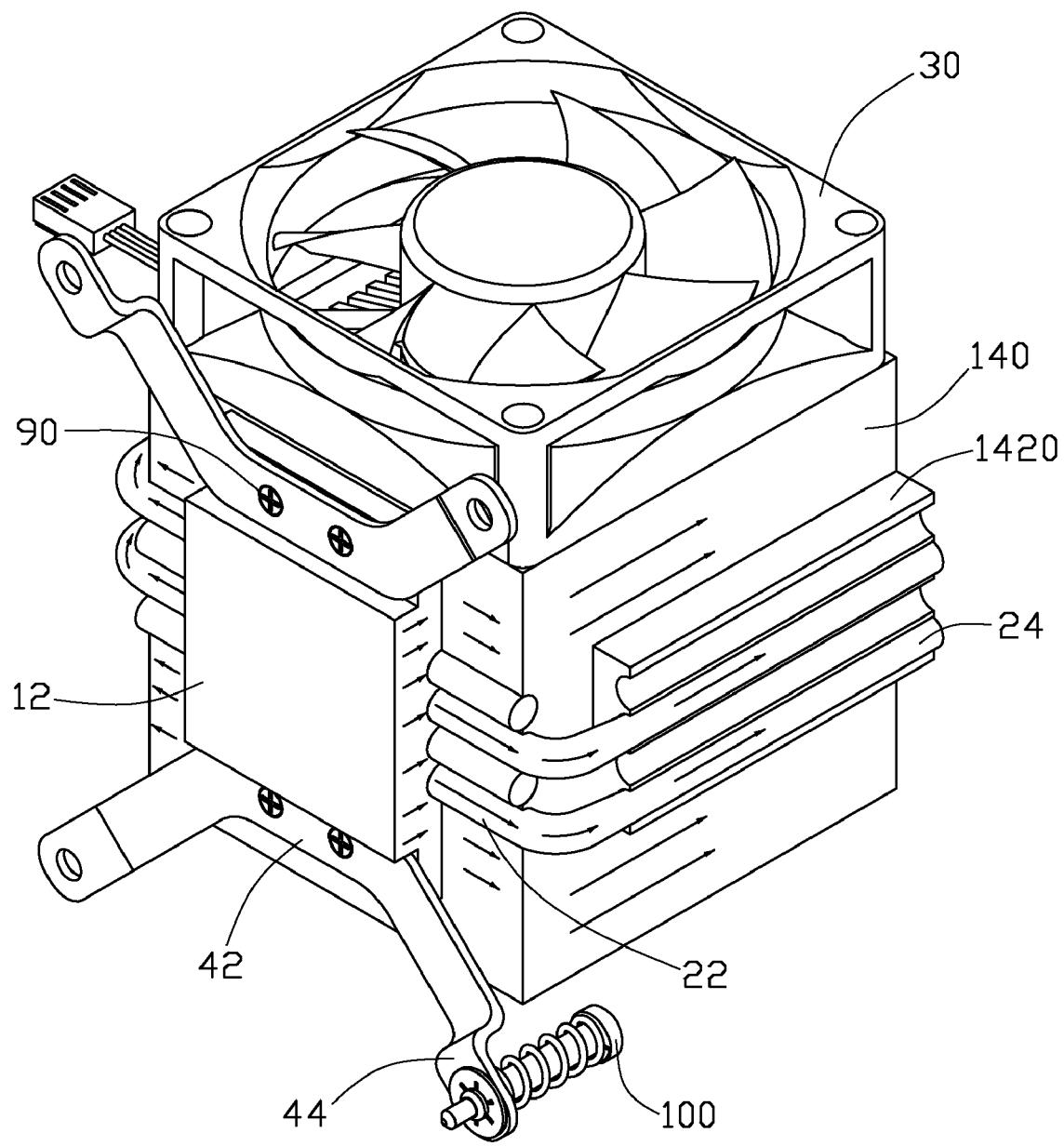
FIG. 3 is a view similar to FIG. 1, but from a different aspect, showing heat transfer paths of the heat dissipation device.

In operation, referring to FIG. 3, heat transfer paths of the heat dissipation device are shown by arrows in FIG. 3. The base 12 of the heat sink 10 absorbs heat from the electronic component (not shown) and a major part of the heat is directly transferred to the heat-receiving sections 22 of the heat pipes 20. A minor part of the heat is conducted upwardly to the fins 160 formed on an inner surface of a bottom sidewall 1410 of the housing 140 of the heat-dissipation portion 14. The major part of the heat received in the heat-receiving sections 22 of the heat pipes 20 is transmitted to the lateral sidewalls 1410 of the housing 140 in contact with the heat-discharging sections 24 of the heat pipes 20 and then to the fins 160 via the four sidewalls 1410. The heat from the base 12 of the heat sink 10 is transferred upwardly to the four sidewalls 1410 of the housing 140 and distributed over the fins 160.

Figure 4:
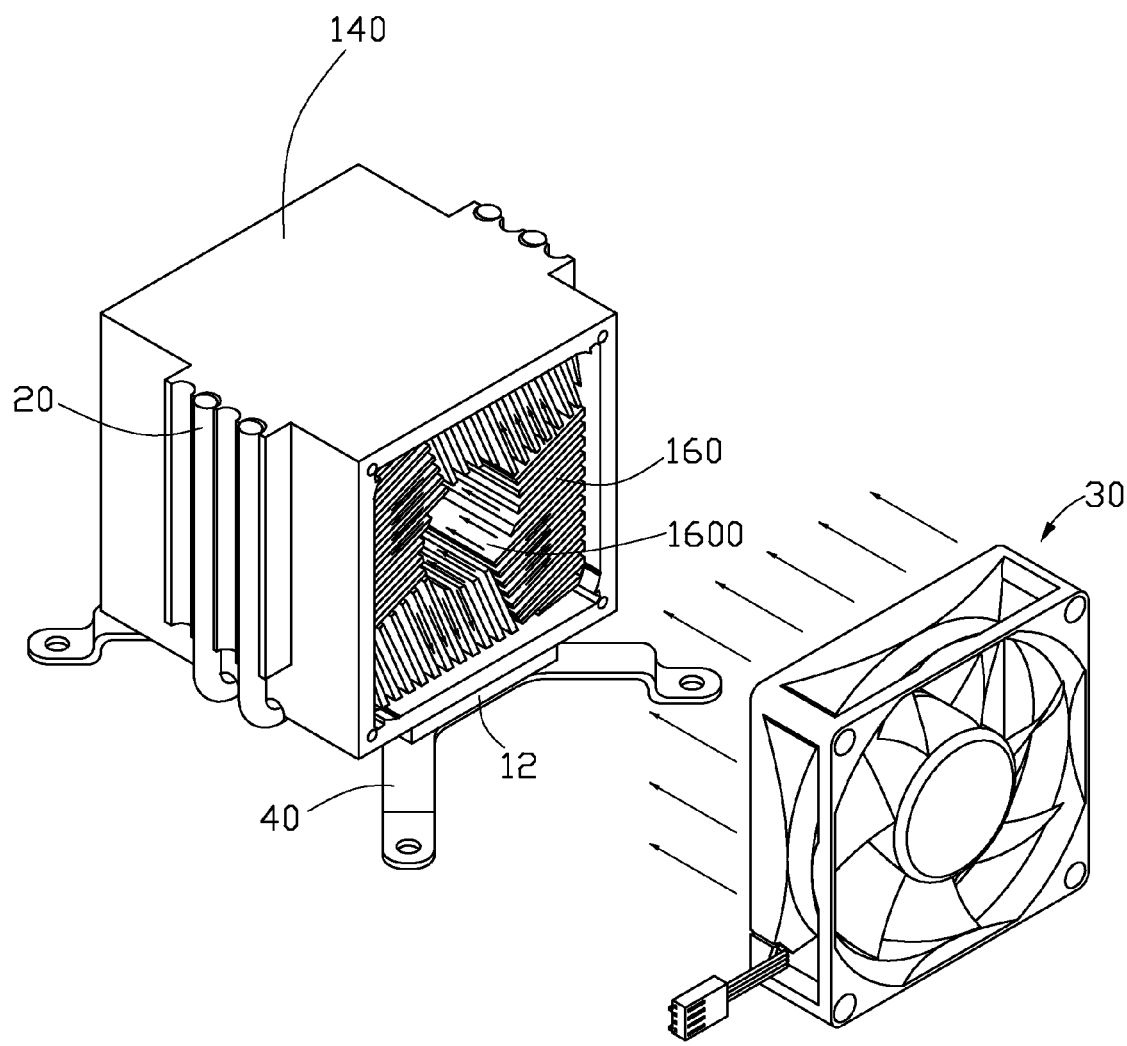
FIG. 4 is an assembled view of FIG. 2, with a fan being separated, showing airflow paths of the heat dissipation device.

Referring to FIG. 4, airflow paths of the heat dissipation device are shown by arrows in FIG. 4. During operation of the fan 30, a large amount of cooling air is drawn into the heat-dissipation portion 14. The arrows show flow directions of the airflow generated by the fan 30, wherein the fan 30 rotates counterclockwise as viewed from a front of the fan 30. The fan 30 blows the airflow into the airflow passages defined between the fins 160 in a direction opposite to the extension directions of the fins 160 from the sidewalls 1410, due to the inclination of the fins 160 relative to their respective sidewalls 1410. The airflow is thus forced to flow outwardly along the airflow passages to reach the sidewalls 1410 before the airflow is forced to flow rearwards out of the heat-dissipation portion 14. Accordingly, the airflow can have a sufficient contact with the inner surfaces of the sidewalls 1410 of the housing 140 where a large amount of heat accumulates and the lower part of each of the fins 160 which is located near the inner surface of a corresponding sidewall 1410 of the housing 140. It is obvious that heat-dissipation efficiency of the heat dissipation device having the housing 140 is enhanced, compared with a heat dissipation device without the housing 140. In addition, the housing 140 is integrally formed with the fins 160 and employed as a fan duct and a fan mounting bracket, so cost of the heat dissipation device is greatly reduced and manufacturing process of the heat dissipation device is time-saving and simple.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device comprising:
   a base adapted for thermally connecting with an electronic component;
   a heat-dissipation portion attached to the base, the heat-dissipation portion comprising a housing attached to the base and a plurality of fins extending inwardly from an inner periphery of the housing, a plurality of airflow passages being defined between the fins;
   a heat pipe comprising a heat-receiving section received in the base and a heat-discharging section extending from an end portion of the heat-receiving section and attached to the housing; and
   a fan directly mounted on the heat-dissipation portion for generating an airflow flowing into the airflow passages;
   wherein the housing encircles the fins and is employed as a fan duct to prevent the airflow from being prematurely dispersed out of the fins along the airflow passages and wherein the airflow has a more sufficient contact with parts of the fins which are located near the inner periphery of the housing; and
   wherein the housing comprises four sidewalls encircling the fins, a pair of flanges protrude from an outer face of one of the sidewalls, and a slot is defined between the flanges for receiving the heat-discharging section of the heat pipe wherein the heat discharging section is exposed to ambient air.

2. The heat dissipation device as claimed in claim 1, wherein the housing has a hollow, square shape.

3. The heat dissipation device as claimed in claim 2, wherein the fins are oriented to define a through hole through a center portion of the heat-dissipation portion.

4. The heat dissipation device as claimed in claim 1, wherein the base defines a groove in a top surface thereof for receiving the heat-receiving section of the heat pipe.

5. The heat dissipation device as claimed in claim 1, wherein the fins are integrally formed on inner surfaces of the sidewalls as a monolithic piece and spaced from each other at uniform intervals.

6. The heat dissipation device as claimed in claim 5, wherein the fins are inclined to the inner faces of the sidewalls, and have different extension lengths to cooperatively define the through hole.

7. The heat dissipation device as claimed in claim 1, wherein the housing defines four screw holes in four corners of an end portion thereof for screws to extend through the fan and screw in the screw holes to secure the fan to the end portion of the housing of the heat-dissipation portion.

8. The heat dissipation device as claimed in claim 1, further comprising two locking members engaging with the base.

9. The heat dissipation device as claimed in claim 8, wherein the base further comprises a pair of locking portions formed at two opposite sides thereof for fastening with the locking members, each locking portion having an undercut therebelow.

10. A heat dissipation device adapted for cooling an electronic component, comprising:
  a base adapted for contacting the electronic component;
  a heat-dissipation portion having a housing soldered to the base and a plurality of fins extending inwardly from an inner circumferential periphery of the housing and defining a plurality of airflow passages between the fins;
  a heat pipe having a heat-receiving section soldered between the base and the housing and a heat-discharging section extending from an end of the heat-receiving section and attached to the housing; and
  a fan directly mounted onto the heat-dissipation portion for generating an airflow to flow into the airflow passages;
  wherein the airflow from the fan enters the airflow passages of the heat-dissipation portion in a direction opposite to an extension direction of the fins from the inner circumferential periphery of the housing; and
  wherein the housing comprises four sidewalls encircling the fins, a pair of flanges protrude from an outer face of one of the sidewalls, and a slot is defined between the flanges for receiving the heat-discharging section of the heat pipe wherein the heat discharging section is exposed to ambient air.

11. The heat dissipation device as claimed in claim 10, wherein the fins extend inwardly from the inner circumferential periphery of the housing and define a through hole through a center portion of the heat-dissipation portion.

12. The heat dissipation device as claimed in claim 10, wherein the fins and the housing are integrally formed as a monolithic piece, and the fins extend inclinedly and inwardly from inner faces of the sidewalls, respectively.

13. The heat dissipation device as claimed in claim 10, further comprising another heat pipe attached to the housing and the base and located opposite to the heat pipe.

14. A heat dissipation device comprising:
  a heat-dissipation portion having a hollow, polygonal housing with a plurality of sidewalls and opened front and rear ends, and a plurality of fins extending inwardly and inclinedly from each of the sidewalls, wherein free ends of the fins cooperatively define a through hole in the housing;
  a heat pipe having a heat-receiving section attached to a bottom one of the sidewalls of the housing and a heat-discharging section attached to a lateral one of the sidewalls of the housing; and
  a fan directly secured to the front end of the housing for generating an airflow through the through hole and the fins;
  wherein a pair of flanges protrude from an outer face of the lateral one of the sidewalls and a slot is defined between the flanges for receiving the heat-discharging section of the heat pipe.

15. The heat dissipation device as claimed in claim 14, further comprising a base attached to the bottom one of the sidewalls of the housing, wherein the heat-receiving section of the heat pipe is sandwiched between the bottom one of the sidewalls of the housing and the base, and a pair of locking members is secured to the base.

* * * * *